United States Patent
Wu (10) Patent No.: US 7,109,552 B2
(45) Date of Patent: Sep. 19, 2006

(54) SELF-ALIGNED TRENCH DMOS TRANSISTOR STRUCTURE AND ITS MANUFACTURING METHODS

(75) Inventor: Ching-Yuan Wu, Hsinchu (TW)

(73) Assignee: Silicon-Based Technology, Corp., Hsinchu (TW)

( * ) Notice: Subject to any disclaimer, the term of this patent is extended or adjusted under 35 U.S.C. 154(b) by 185 days.

(21) Appl. No.: 10/976,865

(22) Filed: Nov. 1, 2004

(65) Prior Publication Data
US 2006/0091452 A1    May 4, 2006

(51) Int. Cl.
*H01L 29/94* (2006.01)
(52) U.S. Cl. .................... 257/335; 257/330
(58) Field of Classification Search ........... 257/335, 257/330, 332, 333, 334
See application file for complete search history.

(56) References Cited

U.S. PATENT DOCUMENTS 6,916,712 B1 * 7/2005 Kocon et al. ............ 438/270

2002/0158277 A1 * 10/2002 Harada et al. ............ 257/288

* cited by examiner

*Primary Examiner*—Douglas W. Owens
(74) *Attorney, Agent, or Firm*—Lowe Hauptman & Berner, LLP (57) ABSTRACT

A self-aligned trench DMOS transistor structure of the present invention comprises a self-aligned source structure and a self-aligned trench gate structure, in which the self-aligned source structure comprises a p-base diffusion region, a self-aligned $n^+$ source diffusion ring, a self-aligned $p^+$ contact diffusion region, and a self-aligned source contact window; the self-aligned trench gate structure comprises a self-aligned silicided conductive gate structure, a self-aligned polycided conductive gate structure or a self-aligned polycided trenched conductive gate structure. The self-aligned trench DMOS transistor structure as described is fabricated by using only one masking photoresist step and can be easily scaled down to obtain a high-density trench DMOS power transistor with ultra low on-resistance, low gate-interconnection parasitic resistance, and high device ruggedness.

20 Claims, 6 Drawing Sheets

SELF-ALIGNED TRENCH DMOS TRANSISTOR STRUCTURE AND ITS MANUFACTURING METHODS

BACKGROUND OF THE INVENTION

1. Field of the Invention

The present invention relates generally to a trench DMOS power transistor and its manufacturing method and, more particularly, to a self-aligned trench DMOS transistor structure and its manufacturing methods.

2. Description of the Prior Art

A DMOS power transistor with very low on-resistance has become an important device for applications in battery protection, switching, linear regulator, amplifier and power management. Basically, the DMOS power transistor structure can be categorized into two groups: planar DMOS transistor structure and trench DMOS transistor structure. The planar DMOS transistor structure with MOS inversion channel being formed in a planar semiconductor surface, in general, exhibits a larger cell area and a larger turn-on resistance as compared to the trench DMOS transistor structure. Therefore, the trench DMOS transistor structure becomes a major trend for applications in fabricating DMOS power transistor and insulated-gate bipolar transistor (IGBT).

Figure 1A:
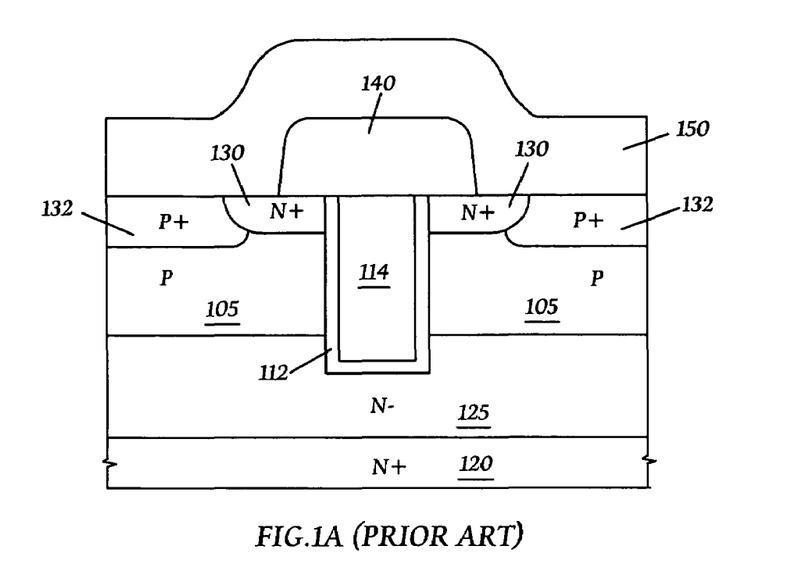
FIG. 1A and FIG. 1B show schematic cross-sectional views of prior-art trench DMOS transistor structures.

FIG. 1A shows a schematic cross-sectional view of a trench DMOS transistor structure of the prior art, in which a shallow trench is formed in a portion of an N$^-$ epitaxial silicon layer 125 on an N$^+$ silicon substrate 120 by using a masking photoresist step. The shallow trench being lined with a thermal oxide layer 112 and then filled with a doped polycrystalline-silicon layer 114 as a conductive gate layer is formed to isolate p-diffusion (or p-base) regions 105. A critical masking photoresist step (not shown) is performed to selectively form n$^+$ source diffusion rings 130. Another critical masking photoresist step (not shown) is performed to pattern an oxide layer 140 over a shallow trench region and on a portion of nearby n$^+$ source diffusion rings 130 and, thereafter, a self-aligned ion implantation is performed to form p$^+$ contact diffusion regions 132 for forming p-base contacts.

Apparently, the doping concentration in the p$^+$ contact diffusion regions 132 must be smaller than that in the n$^+$ source diffusion rings 130. A metal layer 150 is formed over a surface portion of the n$^+$ source diffusion rings 130 and the p$^+$ contact diffusion regions 132 and is patterned to form a source electrode. It is clearly seen that two critical masking photoresist steps are required for forming the n$^+$ source diffusion rings 130 and the p$^+$ diffusion regions 132 and result in difficulty in scaling down the dimension of the p-diffusion regions 105. Moreover, the parasitic resistance of the doped polycrystalline-silicon layer 114 as a gate metal layer is very large for gate interconnection of many trench DMOS transistor cells and may result in a slower switching speed.

Figure 1B:
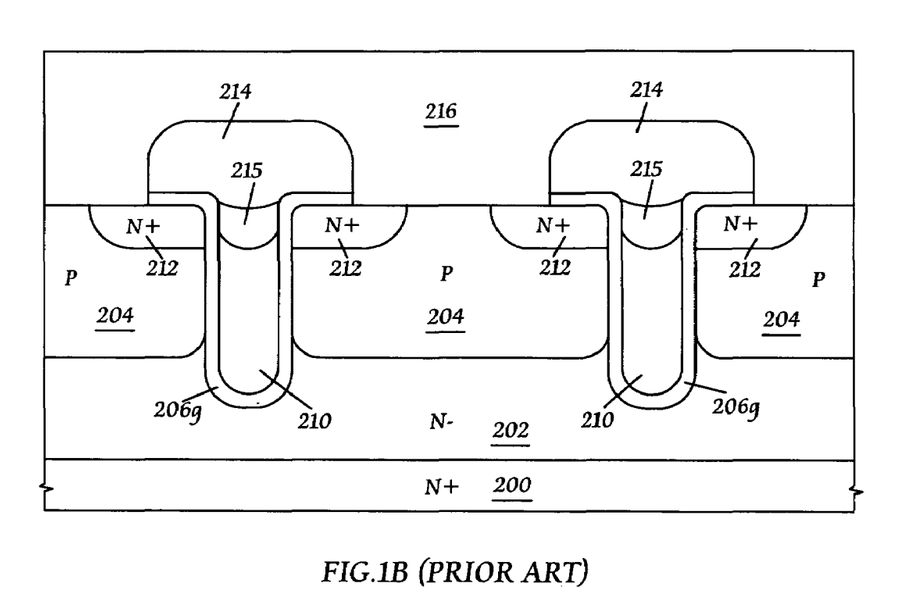

FIG. 1B shows a schematic cross-sectional view of another trench DMOS transistor structure of the prior art, in which a large p-diffusion region 204 is formed in an N$^-$ epitaxial silicon layer 202 on an N$^+$ silicon substrate 200 before forming the shallow trench; a gate-oxide layer 206g is lined over the shallow trench and a top portion of silicon surface; a doped polycrystalline-silicon layer 210 is formed to fill a portion of the shallow trench; and a thermal oxide layer 215 is then formed on a top portion of the doped polycrystalline-silicon layer 210. Similarly, a critical masking photoresist step (not shown) is performed to form n$^+$ source diffusion rings 212 and another critical masking photoresist step (not shown) is performed to simultaneously pattern an oxide layer 214 and the gate-oxide layer 206g. There is no p$^+$ diffusion region 132 as shown in FIG. 1A to improve contact resistance between the p-diffusion regions 204 and the source metal layer 216. It is clearly visualized that two critical masking photoresist steps are also required to form the n$^+$ source diffusion rings 212 and the contacts for the source metal layer 216.

Comparing FIG. 1A and FIG. 1B, it is clearly seen that the overlapping region between the n$^+$ source diffusion ring 212 and the doped polycrystalline-silicon layer 210 for FIG. 1B is reduced and this reduces the gate to source capacitance and improves leakage current between the n$^+$ source diffusion rings 212 and the doped polycrystalline-silicon layer 210. Apparently, the trench DMOS transistor structure shown in FIG. 1B is also difficult to be scaled down due to two critical masking photoresist steps used to define the n$^+$ source diffusion rings 212 and the source metal contacts.

It is therefore a major objective of the present invention to offer a self-aligned trench DMOS transistor structure being fabricated without critical masking photoresist steps.

It is another objective of the present invention to offer a self-aligned trench DMOS transistor structure with a heavily-doped source diffusion ring and a heavily-doped p-base contact diffusion region to improve device ruggedness.

It is a further objective of the present invention to offer a self-aligned trench DMOS transistor structure with different self-aligned conductive gate structures to reduce parasitic gate-interconnection resistance and capacitance.

It is yet an important objective of the present invention to offer a high-density, self-aligned trench DMOS transistor structure with a scalable p-base dimension.

SUMMARY OF THE INVENTION

The present invention discloses a self-aligned trench DMOS transistor structure and its manufacturing methods. The self-aligned trench DMOS transistor structure of the present invention comprises a self-aligned source structure in a source region and a self-aligned trench gate structure in a trench gate region, in which the self-aligned source structure comprises a p-base diffusion region, a self-aligned n$^+$ source diffusion ring, a self-aligned p$^+$ contact diffusion region, and a self-aligned source contact window; the self-aligned trench gate structure comprises a self-aligned silicided conductive gate structure, a self-aligned polycided conductive gate structure or a self-aligned polycided trenched conductive gate structure. The self-aligned n$^+$ source diffusion ring is formed in a surface portion of the p-base diffusion region by using a first self-aligned implantation window formed between a protection dielectric layer and a self-aligned implantation masking layer, wherein the self-aligned implantation masking layer is formed in a middle region surrounded by a sacrificial dielectric spacer and the self-aligned implantation window is formed by removing the sacrificial dielectric spacer. The self-aligned p$^+$ contact diffusion region is formed by a second self-aligned implantation window surrounded by the sacrificial dielectric spacer. The self-aligned source contact is formed in a self-aligned contact window surrounded by a sidewall dielectric spacer being formed over a sidewall of the protection dielectric layer, wherein the protection dielectric layer is formed over an etched-back capping oxide layer in the trench gate region and a buffer oxide layer in the source region. The self-aligned silicided conductive gate structure comprises a gate oxide layer being lined over a trenched silicon surface, an etched-back heavily-doped polycrystalline-silicon layer being formed over the gate oxide layer, and a self-aligned refractory metal silicide layer being formed over a top portion of the etched-back heavily-doped polycrystalline-silicon layer being formed over a portion of the gate oxide layer, wherein a top surface level of the etched-back heavily-doped polycrystalline-silicon layer is higher than a top surface of the buffer oxide layer. The self-aligned polycided conductive gate structure comprises a gate oxide layer being lined over a trenched silicon surface, an etched-back heavily-doped polycrystalline-silicon layer being formed over a portion of the gate oxide layer, a pair of capping oxide spacers being formed on a side surface portion of the etched-back heavily-doped polycrystalline-silicon layer, and an etched-back capping conductive layer being formed over the etched-back heavily-doped polycrystalline-silicon layer between the pair of capping oxide spacers, wherein a top surface level of the etched-back heavily-doped polycrystalline-silicon layer is lower than a bottom surface level of the buffer oxide layer. The self-aligned polycided trenched conductive gate structure comprises a gate oxide layer being lined over a trenched silicon surface, a trenched heavily-doped polycrystalline-silicon layer being formed over a portion of the gate oxide layer, a pair of capping oxide spacers being formed on side surface portions of the trenched heavily-doped polycrystalline-silicon layer to pattern the trenched heavily-doped polycrystalline-silicon layer, and an etched-back capping conductive layer being used to fill a shallow trench formed by the trenched heavily-doped polycrystalline-silicon layer and a portion between the pair of capping oxide spacers. The self-aligned trench DMOS transistor structure as described is fabricated by using only one masking photoresist step and exhibits the following advantages and features as compared to the prior arts: the source region can be easily scaled down to have a minimum trench DMOS transistor size; the self-aligned n$^+$ source diffusion ring and the self-aligned p$^+$ contact diffusion region are heavily doped in a self-aligned manner to improve the source and p-base contact resistances; the self-aligned source contact is formed in a self-aligned manner to improve ruggedness of trench DMOS transistor; and a highly conductive gate layer is used as a trench gate conductive layer to improve parasitic gate-interconnection resistance and a further scaling down of the trench width can be easily obtained.

DETAILED DESCRIPTION OF THE PREFERRED EMBODIMENTS

Referring now to FIG. 2A through FIG. 2J, there are shown process steps and their schematic cross-sectional views of fabricating a self-aligned trench DMOS transistor structure for a first embodiment of the present invention.

Figure 2A:
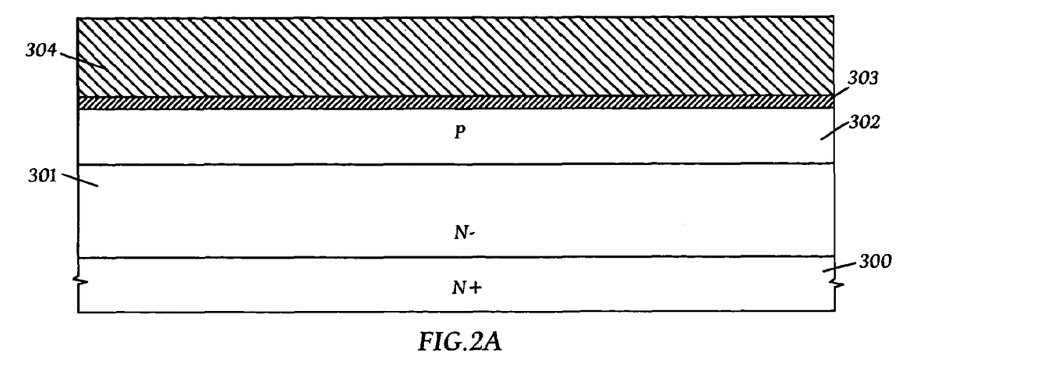
FIG. 2A through FIG. 2J show process steps and their cross-sectional views of forming a self-aligned trench DMOS transistor structure for a first embodiment of the present invention.

FIG. 2A shows that a p-diffusion region 302 is formed in an epitaxial silicon substrate 301/300 with an N$^-$ epitaxial silicon layer 301 being formed on an N$^+$ silicon substrate 300; a buffer oxide layer 303 is then formed on the p-diffusion region 302; and thereafter, a masking dielectric layer 304 is formed on the buffer oxide layer 303. The masking dielectric layer 304 is preferably made of silicon nitride as deposited by low pressure chemical vapor deposition (LPCVD). The buffer oxide layer 303 is preferably a thermal silicon dioxide layer or a silicon dioxide layer as deposited by LPCVD. It should be noted that the doping types shown in FIG. 2A are mainly used to fabricate trench n-channel DMOS transistors. Similarly, trench p-channel DMOS transistors can be fabricated by using the opposite doping type.

Figure 2B:
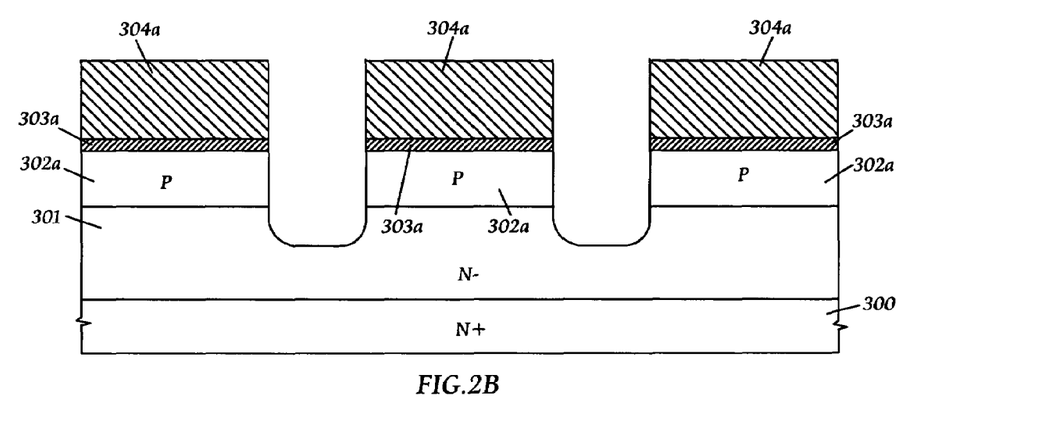

FIG. 2B shows that a masking photoresist (PR1) step (not shown) is performed to define a trench gate region; and subsequently, the masking dielectric layer 304, the buffer oxide layer 303, the p-diffusion region 302 and the N$^-$ epitaxial silicon layer 301 are sequentially etched by anisotropic dry etching to form a shallow trench. It should be noted that a plurality of p-base diffusion regions 302a are isolated by the shallow trench and the shape of the p-base diffusion regions 302a can be square, hexagon, rectangular, and circular etc. The depth of the shallow trench is slightly larger than the junction depth of the p-base diffusion regions 302a.

Figure 2C:
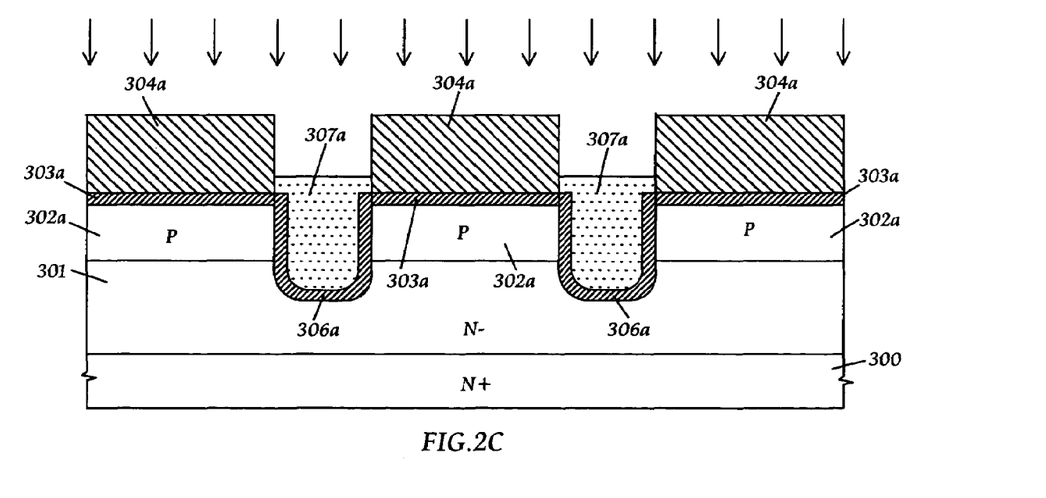

FIG. 2C shows that a gate oxide layer 306a is formed over an exposed trenched silicon surface and an etched-back conductive layer 307a is formed over the gate oxide layer 306a. It should be noted that before forming the gate oxide layer 306a, a liner oxide layer (not shown) is formed over the exposed trenched silicon surface by a conventional thermal oxidation process and is then removed by dipping in a dilute hydrofluoric acid to eliminate trench-induced defects. The gate oxide layer 306a is preferably a thermal silicon dioxide layer grown in dry oxygen ambient or a thermal silicon dioxide layer nitrided in a nitrous oxide (N$_2$O) ambient. The etched-back conductive layer 307a is preferably made of doped polycrystalline-silicon as deposited by LPCVD and is formed by depositing a doped polycrystalline-silicon layer 307 (not shown) with a thickness equal to or slightly larger than one half width of the shallow trench and then etching back the deposited doped polycrystalline-silicon layer 307 by using anisotropic dry etching. The top surface level of the etched-back conductive layer 307a is formed to be higher than the buffer oxide layer 303a. It should be emphasized that ion-implantation can be performed to heavily dope the etched-back conductive layer 307a using arsenic or phosphorous ions and a self-aligned silicidation process can be performed to form a refractory metal-silicide layer (not shown) over the etched-back conductive layer 307a.

Figure 2D:
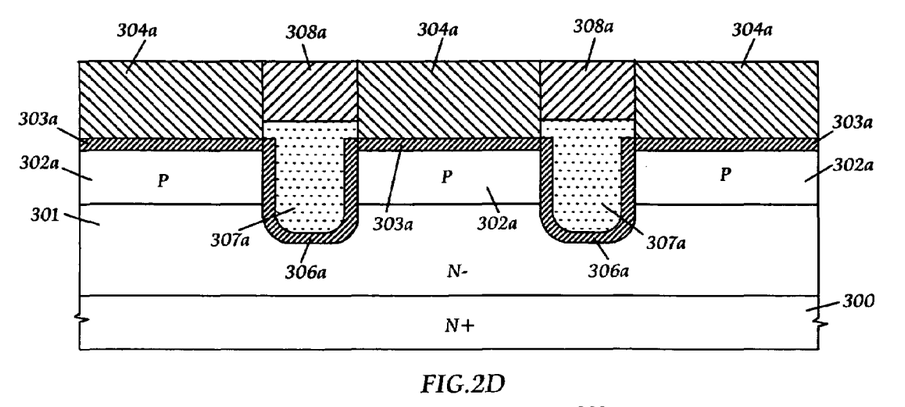

FIG. 2D shows that an etched-back capping oxide layer 308a is formed to fill a gap in the shallow trench. The etched-back capping oxide layer 308a is preferably made of silicon dioxide as deposited by LPCVD and is formed by first depositing a silicon dioxide layer 308 (not shown) with a thickness approximately equal to or slightly larger than one half width of the shallow trench and then etching back a thickness of the deposited silicon dioxide layer 308 using anisotropic dry etching.

Figure 2E:
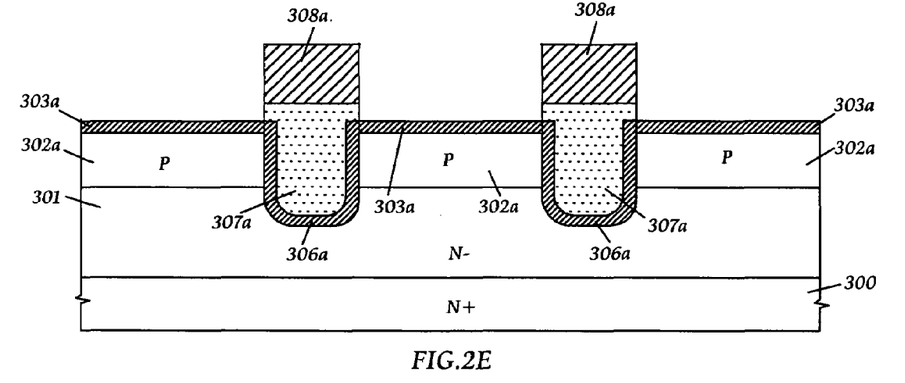

FIG. 2E shows that the patterned masking dielectric layers 304a in the source regions are selectively removed by anisotropic dry etching or hot phosphoric acid. It is clearly seen that ion implantation can be performed in this step to form the p-base diffusion regions 302a instead of performing in FIG. 2A. The major difference is that the p-base diffusion regions 302a performed in FIG. 2A may experience larger boron dopant segregation than the p-base diffusion regions 302a formed in FIG. 2E. The boron dopant segregation may result in a lower punch-through voltage for the trench DMOS transistors.

Figure 2F:
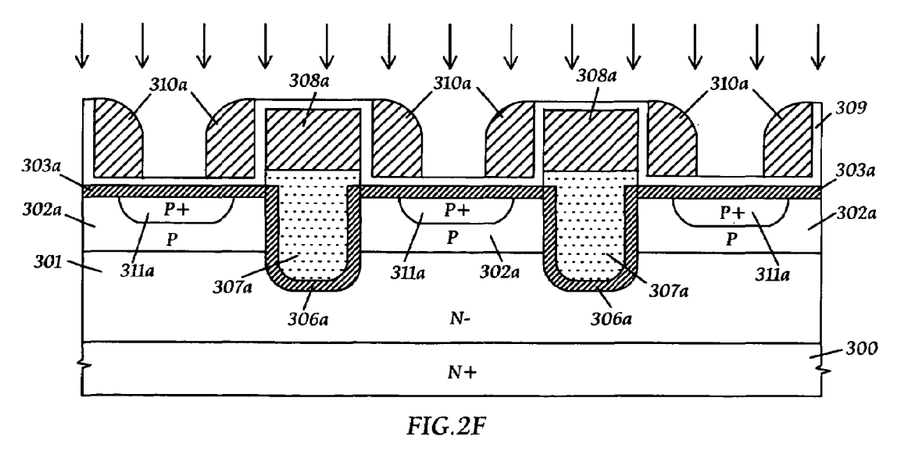

FIG. 2F shows that a protection dielectric layer 309 is formed over a formed structure surface shown in FIG. 2E; a sacrificial dielectric spacer 310a is then formed over each of inner sidewalls in the source regions; subsequently, ion implantation is performed in a self-aligned manner across the protection dielectric layer 309 and the buffer oxide layer 303a to form a self-aligned p$^+$ contact diffusion region 311a in a surface portion of the p-base diffusion region 302a. The protection dielectric layer 309 is preferably made of silicon nitride as deposited by LPCVD. The sacrificial dielectric spacer 310a is preferably made of silicon dioxide as deposited by LPCVD and is formed by first depositing a silicon dioxide layer 310(not shown) over the protection dielectric layer 309 and then etching back a thickness of the deposited silicon dioxide layer 310.

Figure 2G:
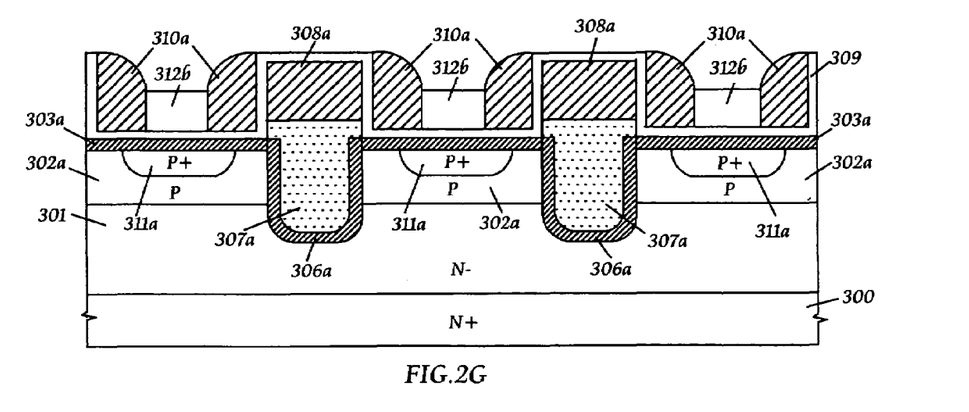

FIG. 2G shows that a self-aligned implantation masking layer 312b is formed in a middle region surrounded by the sacrificial dielectric spacer 310a. The self-aligned implantation masking layer 312b is preferably made of organic polymer or polycrystalline-silicon material and is formed by depositing the masking layer 312a (not shown) and then etching back the deposited masking layer 312a. The organic polymer material is preferably made of photoresist or polyimide. For polycrystalline-silicon material as the self-aligned implantation masking layer 312b, a thickness of the polycrystalline-silicon layer 312a (not shown) being equal to or slightly thicker than one half spacing surrounded by the sacrificial dielectric spacer 310a is first deposited by LPCVD to fill the gap and is then etched back to a desired thickness by using anisotropic dry etching. For organic polymer material as the self-aligned implantation masking layer 312b, the organic polymer layer 312 is first spinned on the wafer and is then etched back to a desired thickness by chemical etching or plasma etching.

Figure 2H:
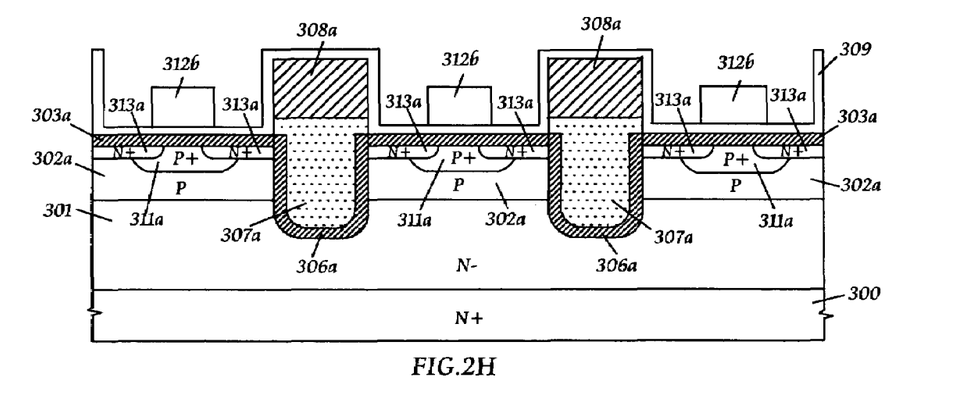

FIG. 2H shows that the sacrificial dielectric spacers 310a are selectively removed by using buffered hydrofluoric acid; and subsequently, ion implantation is performed across the protection dielectric layer 309 and the buffer oxide layer 303a in a self-aligned manner to form a self-aligned n$^+$ source diffusion ring 313a in a surface portion of the p-base diffusion region 302a.

Figure 2I:
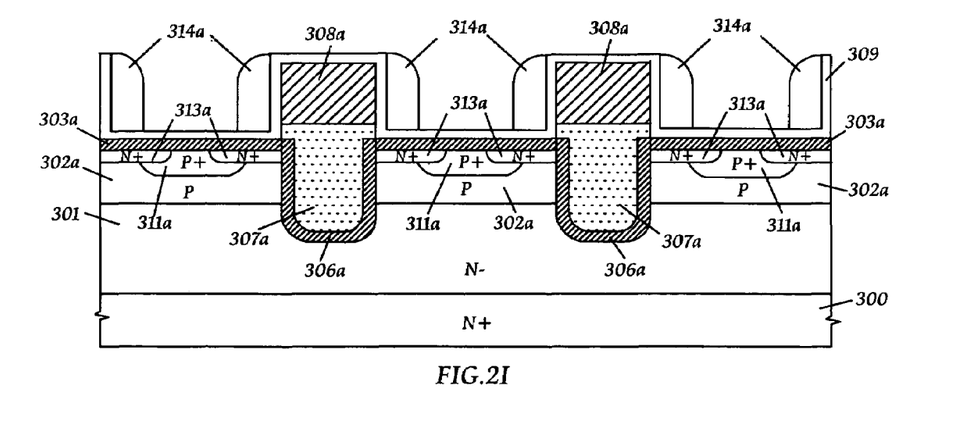

FIG. 2I shows that the self-aligned implantation masking layer 312b in each of the source regions is removed by plasma ashing or anisotropic dry etching; a drive-in process is performed to form the self-aligned source diffusion ring 313a in each of the source regions; and subsequently, a sidewall dielectric spacer 314a is formed over a sidewall of the protection dielectric layer 309 and on a side portion of the protection dielectric layer 309 in each of the source regions. The sidewall dielectric spacer 314a is preferably made of silicon dioxide or silicon nitride as deposited by LPCVD.

Figure 2J:
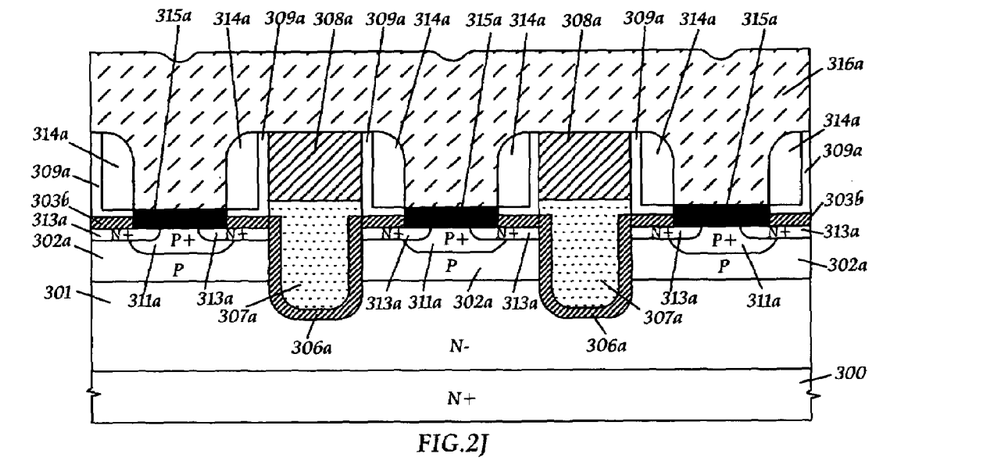

FIG. 2J shows that a self-aligned contact window (not shown) is formed in each of the source regions by sequentially removing the protection dielectric layer 309 and the buffer oxide layer 303a surrounded by a sidewall dielectric spacer 314a; a self-aligned silicidation process is then performed to form a refractory metal-silicide layer 315a in each of the self-aligned contact windows; and subsequently, a source metal layer 316 (not shown) is formed and patterned to interconnect each of the refractory metal-silicide layers 315a. The refractory metal-silicide layer 315a is preferably made of titanium disilicide (TiSi$_2$), cobalt disilicide (CoSi$_2$), nickel disilicide (NiSi$_2$), etc. The patterned metal layer 316a comprises an aluminum alloy layer over a barrier-metal layer (not shown) and the barrier metal layer is preferably made of titanium nitride (TiN) and tantalum nitride (TaN). It should be noted that the refractory metal-silicide layer 315a shown in FIG. 2J can be neglected and the aluminum alloy layer can be directly acted as a contact metal.

From the first embodiment of the present invention as shown in FIG. 2J, it is clearly seen that the self-aligned trench DMOS transistor structure exhibits the following advantages and features as compared to the prior arts:

(a) The self-aligned n$^+$ source diffusion ring and the self-aligned p$^+$ contact diffusion region are heavily doped and formed by using a self-aligned implantation masking layer without using any masking photoresist step as compared to one critical masking photoresist step used by the prior arts.

(b) The self-aligned source contact window is formed without using any masking photoresist step as compared to one critical masking photoresist step used by the prior arts.

(c) The source contact resistance is small due to the self-aligned n$^+$ diffusion ring and the self-aligned p$^+$ contact diffusion region and, therefore, the self-aligned trench DMOS transistor structure can be easily scaled down further to offer a smaller cell size.

(d) The ruggedness of the self-aligned trench DMOS transistor structure is much better than those of the prior arts being fabricated by using non self-aligned technique.

Figure 3A:
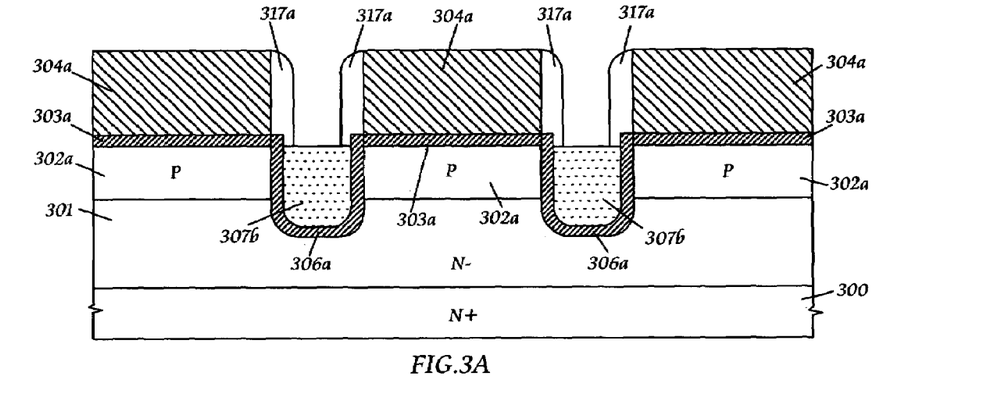
FIG. 3A through FIG. 3C show simplified process steps after FIG. 2C and their cross-sectional views of forming a self-aligned trench DMOS transistor structure for a second embodiment of the present invention.
Figure 3B:
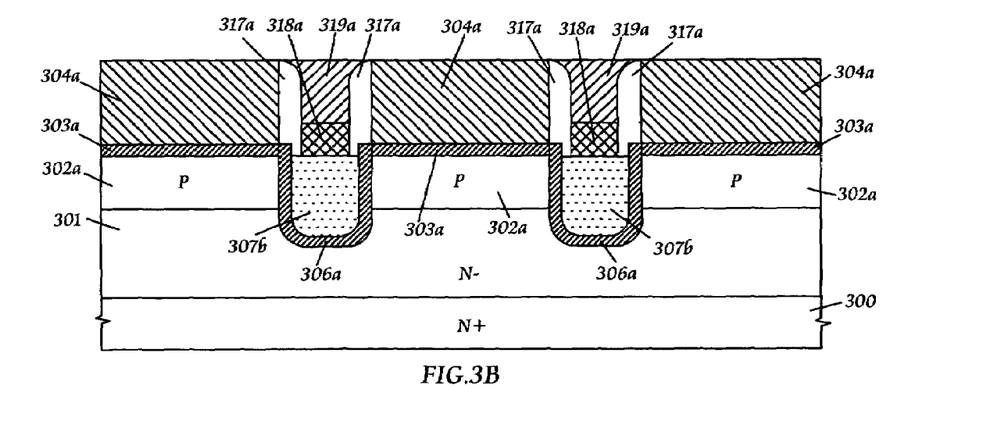
Figure 3C:
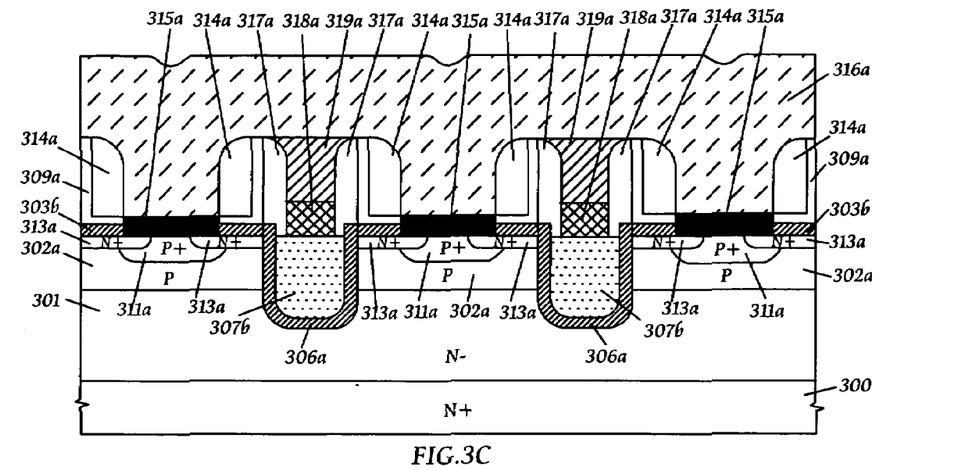

Referring now to FIG. 3A through FIG. 3C, there are shown simplified process steps after FIG. 2C and their cross-sectional views for fabricating a second embodiment of the present invention.

FIG. 3A shows that a top surface level of the etched-back conductive layer 307a shown in FIG. 2C is etched back to be equal to or lower than a bottom surface of the buffer oxide layer 303a and a pair of capping oxide spacers 317a are then formed over sidewalls of the patterned masking dielectric layers 304a and on side portions of the etched-back conductive layer 307b.

FIG. 3B shows that an etched-back capping conductive layer 318a is formed on the etched-back conductive layer 307b between the pair of capping oxide spacers 317a; and subsequently, an etched-back capping oxide layer 319a is formed to fill a gap between the pair of capping oxide spacers 317a and on the etched-back capping conductive layer 318a. The etched-back capping conductive layer 318a is preferably made of tungsten disilicide (WSi$_2$) or tungsten (W).

Similarly, following the same process steps as shown in FIG. 2E through FIG. 2J, the second embodiment of the present invention as shown in FIG. 3C can be obtained. From FIG. 3C, it is clearly seen that the major differences between FIG. 3C and FIG. 2J are:

(a) The trench corners are capped with a pair of capping oxide spacers 317a as shown in FIG. 3C, so the leakage current produced between the self-aligned n⁺ source diffusion ring 313a and the etched-back conductive layer 307b can be eliminated and the overlapping capacitance between the gate electrode and the source electrode can be reduced.

(b) The etched-back conductive layer 307b is capped with an etched-back capping conductive layer 318a, the parasitic gate-interconnect resistance can be reduced.

Figure 4A:
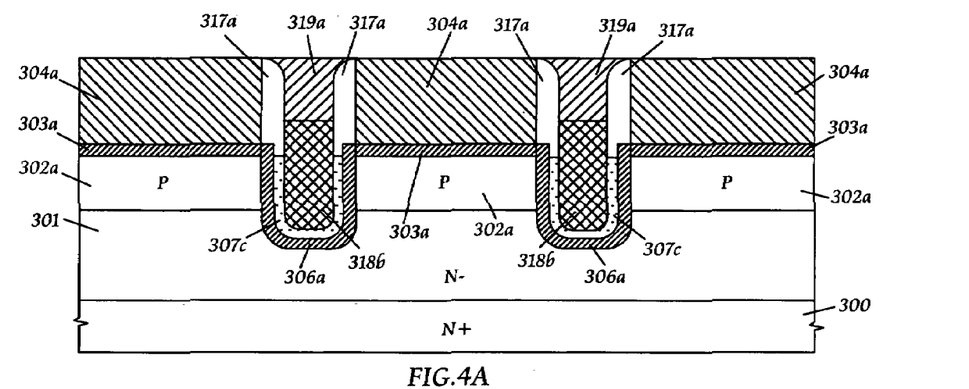
FIG. 4A and FIG. 4B show simplified process steps after FIG. 3A and their cross-sectional views of forming a self-aligned trench DMOS transistor structure for a third embodiment of the present invention.
Figure 4B:
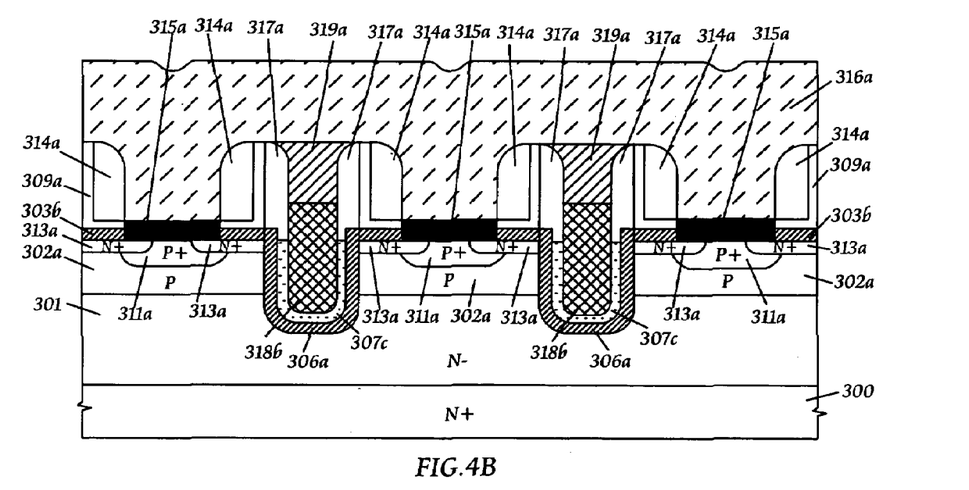

Referring now to FIG. 4A and FIG. 4B, there are shown simplified process steps after FIG. 3A and their cross-sectional views for fabricating a third embodiment of the present invention.

FIG. 4A shows that the etched-back conductive layer 307b between the pair of capping oxide spacers 317a is etched-back to form a trenched conductive layer 307c; an etched-back capping conductive layer 318b is then formed to fill a gap between the pair of capping oxide spacers 317a; and subsequently, an etched-back capping oxide layer 319a is formed on the etched-back capping conductive layer 318b between the pair of capping oxide spacers 317a.

Similarly, following the same process steps as shown in FIG. 2E through FIG. 2J, the third embodiment of the present invention as shown in FIG. 4B can be easily obtained. From FIG. 4B, it is clearly seen that the trenched conductive layer 307c offers a larger volume for forming the etched-back capping conductive layer 318b to further improve the parasitic gate-interconnection resistance, as compared to FIG. 3C. Apparently, the trench width as shown in FIG. 4B can be further scaled down without serious parasitic gate-interconnection resistance.

It should be emphasized that the self-aligned trench n-channel DMOS transistor structures shown in FIG. 2J, FIG. 3C and FIG. 4B can be easily modified to form the self-aligned trench p-channel DMOS transistor structures by using opposite dopant types in different semiconductor regions. Moreover, the self-aligned trench DMOS transistor structures as described can be extended to form insulated-gate bipolar transistors (IGBT) and MOS-controlled thyristors (MCT).

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention

What is claimed is:

1. A self-aligned trench DMOS transistor structure, comprising:

a semiconductor substrate of a first conductivity type, wherein the semiconductor substrate comprises a lightly-doped epitaxial semiconductor layer being formed on a heavily-doped semiconductor substrate;

a source region being formed in the lightly-doped epitaxial semiconductor layer surrounded by a trench gate region, wherein the source region comprises a base diffusion region of a second conductive type, a self-aligned heavily-doped contact diffusion region of the second conductivity type being formed in a middle surface portion of the base diffusion region through a first self-aligned implantation window, a self-aligned heavily-doped source diffusion ring of the first conductivity type being formed in an outer surface portion of the base diffusion region and on an outer surface portion of the self-aligned heavily-doped contact diffusion region through a second self-aligned implantation window, and a self-aligned source contact window being formed by a semiconductor surface of the self-aligned heavily-doped contact diffusion region surrounded by the self-aligned heavily-doped source diffusion ring and an inner semiconductor surface of the self-aligned heavily-doped source diffusion ring;

the trench gate region being formed in the semiconductor substrate with a shallow trench depth being formed slightly larger than a junction depth of the moderately-doped base diffusion region and within the lightly-doped epitaxial semiconductor layer, wherein the trench gate region further comprises a gate oxide layer being formed over a trenched semiconductor surface, a highly conductive composite gate layer being formed over the gate oxide layer and an etched-back capping oxide layer being formed on the highly conductive composite gate layer; and a source metal layer being at least formed on the self-aligned source contact window in the source region and on the etched-back capping oxide layer in the trench gate region.

2. The self-aligned trench DMOS transistor structure according to claim 1, wherein the semiconductor substrate is made of single crystalline-silicon.

3. The self-aligned trench DMOS transistor structure according to claim 1, wherein the highly conductive composite gate layer comprises an etched-back heavily-doped polycrystalline-silicon layer being formed over the gate oxide layer and silicided with a refractory metal silicide layer.

4. The self-aligned trench DMOS transistor structure according to claim 1, wherein the highly conductive composite gate layer comprises an etched-back heavily-doped polycrystalline-silicon layer being formed over a portion of the gate oxide layer and an etched-back capping refractory metal-silicide or refractory metal layer being formed on the etched-back heavily-doped polycrystalline-silicon layer between a pair of capping oxide spacers formed over sidewalls of the trench gate region and on side surface portions of the etched-back heavily-doped polycrystalline-silicon layer.

5. The self-aligned trench DMOS transistor structure according to claim 1, wherein the highly conductive composite gate layer comprises a trenched heavily-doped polycrystalline-silicon layer being formed by forming a trench in an etched-back heavily-doped polycrystalline-silicon layer between a pair of capping oxide spacers formed over sidewalls of the trench gate region and on side surface portions of the etched-back heavily-doped polycrystalline-silicon layer and an etched-back capping refractory metal-silicide or refractory metal layer being formed to fill the trench in the trenched heavily-doped polycrystalline-silicon layer and a portion between the pair of capping oxide spacers.

6. The self-aligned trench DMOS transistor structure according to claim 1, wherein the first self-aligned implantation window is formed to be surrounded by a sacrificial dielectric spacer being formed over a sidewall of a protection dielectric layer formed over a sidewall of the trench gate region and on the protection dielectric layer formed on a buffer oxide layer in the source region.

7. The self-aligned trench DMOS transistor structure according to claim 1, wherein the second self-aligned implantation window is formed by removing a sacrificial dielectric spacer being formed between a protection dielectric layer formed over a sidewall of the trench gate region and a self-aligned implantation masking layer surrounded by the sacrificial dielectric spacer.

8. The self-aligned trench DMOS transistor structure according to claim 1, wherein the self-aligned source contact window is formed by the semiconductor surface portion being surrounded by a sidewall dielectric spacer formed over a sidewall of a protection dielectric layer and on a side surface portion of the protection dielectric layer in the source region.

9. The self-aligned trench DMOS transistor structure according to claim 1, wherein the source metal layer comprises a refractory metal-silicide layer being formed over the self-aligned source contact window and a metal layer over a barrier metal layer being at least formed over the refractory metal silicide layer.

10. The self-aligned trench DMOS transistor structure according to claim 7, wherein the self-aligned implantation masking layer is formed by etching back an organic polymer layer or a polycrystalline-silicon layer being formed on the protection dielectric layer surrounded by the sacrificial dielectric spacer.

11. A self-aligned trench DMOS transistor structure, comprising:
a single crystalline-silicon substrate of a first conductivity type, wherein the single crystalline-silicon substrate comprises a lightly-doped epitaxial silicon layer formed on a heavily-doped silicon substrate;
a trench gate region with a shallow trench being formed in the lightly-doped epitaxial silicon layer, wherein the trench gate region further comprises a gate oxide layer being formed over a trenched silicon surface, a highly conductive composite gate layer being formed over the gate oxide layer and an etched-back capping oxide layer being formed on the highly conductive composite gate layer;
a source region being surrounded by the trench gate region, wherein the source region further comprises a base diffusion region of a second conductivity type with a junction depth slightly smaller than a trench depth in the trench gate region, a heavily-doped contact diffusion region of the second conductivity type being formed in a middle surface portion of the base diffusion region through a first self-aligned implantation window surrounded by a sacrificial dielectric spacer, a heavily-doped source diffusion ring of the first conductivity type being formed in a side surface portion of the base diffusion region and on an outer surface portion of the heavily-doped contact diffusion region through a second self-aligned implantation window formed between a protection dielectric layer and a self-aligned implantation masking layer surrounded by the sacrificial dielectric spacer, and a self-aligned source contact window being formed in the source region through a window surrounded by a sidewall dielectric spacer formed over a sidewall of the protection dielectric layer and on a side portion of the protection dielectric layer; and
a source metal layer being at least formed over the self-aligned source contact window.

12. The self-aligned trench DMOS transistor structure according to claim 11, wherein the protection dielectric layer being made of silicon nitride is formed over the etched-back capping oxide layer in the trench gate region and on a buffer oxide layer in the source region.

13. The self-aligned trench DMOS transistor structure according to claim 11, wherein the self-aligned implantation masking layer is formed by using an etched-back organic polymer or polycrystalline-silicon layer.

14. The self-aligned trench DMOS transistor structure according to claim 11, wherein the source metal layer comprises a refractory metal silicide layer being formed over the self-aligned source contact window and a metal layer over a barrier-metal layer being at least formed over the refractory metal silicide layer.

15. A self-aligned trench DMOS transistor structure, comprising:
a single crystalline-silicon substrate of a first conductivity type, wherein the single crystalline-silicon substrate comprises a lightly-doped epitaxial silicon layer being formed on a heavily-doped silicon substrate;
a trench gate region with a shallow trench being formed in the lightly-doped epitaxial silicon layer, wherein the trench gate region further comprises a gate oxide layer being formed over a trenched silicon surface, an etched-back heavily-doped polycrystalline-silicon layer being formed over a portion of the gate oxide layer, a pair of capping oxide spacers being formed over sidewalls of the trench gate region and on side surface portions of the etched-back heavily-doped polycrystalline-silicon layer, an etched-back highly conductive layer being formed to partially fill a gap between the pair of capping oxide spacers, and an etched-back capping oxide layer being formed on the etched-back highly conductive layer between the pair of capping oxide spacers;
a source region being surrounded by the trench gate region, wherein the source region further comprises a base diffusion region of a second conductivity type with a junction depth slightly smaller than a trench depth in the trench gate region, a heavily-doped contact diffusion region of the second conductivity type being formed in a middle surface portion of the base diffusion region through a first self-aligned implantation window surrounded by a sacrificial dielectric spacer, a heavily-doped source diffusion ring of the first conductivity type being formed in a side surface portion of the base diffusion region and on an outer surface portion of the heavily-doped contact diffusion region through a second self-aligned implantation window formed between a protection dielectric layer and a self-aligned implantation masking layer surrounded by the sacrificial dielectric spacer, and a self-aligned source contact window being formed in the source region through a window surrounded by a sidewall dielectric spacer formed over a sidewall of the protection dielectric layer and on a side portion of the protection dielectric layer in the source region; and
a source metal layer being at least formed over the self-aligned source contact window.

16. The self-aligned trench DMOS transistor structure according to claim 15, wherein the etched-back heavily-doped polycrystalline-silicon layer is further etched anisotropically to form a shallow trench between the pair of capping oxide spacers.

17. The self-aligned trench DMOS transistor structure according to claim 15, wherein the sacrificial dielectric spacer is formed over a sidewall of the protection dielectric layer being formed over a sidewall of the trench gate region and on a buffer oxide layer in the source region.

18. The self-aligned trench DMOS transistor structure according to claim 15, wherein the self-aligned implantation masking layer being formed to be surrounded by a sacrificial dielectric spacer is formed by an etched-back organic polymer or polycrystalline-silicon layer.

19. The self-aligned trench DMOS transistor structure according to claim 15, wherein the source metal layer comprises a refractory metal silicide layer being formed over the self-aligned source contact window and an aluminum alloy metal layer on a barrier-metal layer being at least formed over the refractory metal-silicide layer.

20. The self-aligned trench DMOS transistor structure according to claim 15, wherein the sacrificial dielectric spacer being made of silicon dioxide is selectively removed to form the second self-aligned implantation window.

* * * * *